United States Patent
Mather et al.

(10) Patent No.: US 10,168,397 B2
(45) Date of Patent: *Jan. 1, 2019

(54) MAGNETIC FIELD SENSOR WITH INCREASED FIELD LINEARITY

(71) Applicant: Everspin Technologies, Inc., Chandler, AZ (US)

(72) Inventors: Phillip G. Mather, Phoenix, AZ (US); Bradley Neal Engel, Chandler, AZ (US); Guido De Sandre, Brugherio (IT)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/885,140

(22) Filed: Jan. 31, 2018

(65) Prior Publication Data
US 2018/0156876 A1    Jun. 7, 2018

Related U.S. Application Data

(63) Continuation of application No. 15/134,134, filed on Apr. 20, 2016, now Pat. No. 9,910,106.
(Continued)

(51) Int. Cl.
*G01R 33/09*      (2006.01)

(52) U.S. Cl.
CPC ......... *G01R 33/091* (2013.01); *G01R 33/096* (2013.01); *G01R 33/098* (2013.01)

(58) Field of Classification Search
None
See application file for complete search history.

(56) References Cited

U.S. PATENT DOCUMENTS

| | | | | |
|---|---|---|---|---|
| 6,075,361 A | * | 6/2000 | Coehoorn | B82Y 25/00 324/225 |
| 6,104,632 A | * | 8/2000 | Nishimura | G11C 11/15 257/E27.005 |

(Continued)

FOREIGN PATENT DOCUMENTS

| WO | WO 98/48291 A2 | 10/1998 |
|---|---|---|
| WO | WO 2015/030872 A1 | 3/2015 |

OTHER PUBLICATIONS

International Search Report and Written Opinion issued in corresponding International Application No. PCT/US2016/029594, dated Jul. 27, 2016 (11 pages).

(Continued)

*Primary Examiner* — Melissa Koval
*Assistant Examiner* — Nasima Monsur
(74) *Attorney, Agent, or Firm* — Bookoff McAndrews, PLLC

(57) ABSTRACT

A magnetic field sensor includes a plurality of transducer legs coupled together as a first circuit to sense a magnetic field, wherein each transducer leg comprises a plurality of magnetoresistance sense elements. The magnetic field sensor also includes a second circuit including a first plurality of current lines, wherein each current line of the first plurality of current lines is adjacent to a corresponding plurality of magnetoresistance sense elements of a transducer leg of the plurality of transducer legs. When at least one current line of the first plurality of current lines is energized, a magnetization of each magnetoresistance sense element of the transducer leg is aligned in a first direction or a second direction opposite to the first direction. A routing pattern of the at least one current line is configured to generate an equal population of magnetoresistance sense (Continued)

elements with magnetization aligned in the first and second directions.

20 Claims, 8 Drawing Sheets

Related U.S. Application Data

(60) Provisional application No. 62/154,210, filed on Apr. 29, 2015.

(56) References Cited

U.S. PATENT DOCUMENTS

| | | | |
|---|---|---|---|
| 6,573,713 | B2 | 6/2003 | Torok et al. |
| 7,682,840 | B2 | 3/2010 | Hiebert et al. |
| 8,283,921 | B2 | 10/2012 | Huber et al. |
| 9,910,106 | B2 | 3/2018 | Mather et al. |
| 2004/0021544 | A1 | 2/2004 | Wan |
| 2004/0052006 | A1 | 3/2004 | Odagawa et al. |
| 2006/0023491 | A1 | 2/2006 | Boeve |
| 2006/0202692 | A1* | 9/2006 | Tatschl .............. G01L 25/00 324/252 |
| 2009/0102465 | A1* | 4/2009 | Jansen ............... B82Y 25/00 324/207.21 |
| 2009/0243607 | A1 | 10/2009 | Mather et al. |
| 2011/0169488 | A1* | 7/2011 | Mather ............ G01R 33/0035 324/252 |
| 2013/0221949 | A1* | 8/2013 | Liu ................. G01R 33/0011 324/202 |
| 2013/0277781 | A1* | 10/2013 | Deak ................. B82Y 25/00 257/421 |
| 2013/0300402 | A1 | 11/2013 | Liu et al. |

OTHER PUBLICATIONS

AN215 Application Note, "Cross Axis Effect for AMR Magnetic Sensors," Honeywell Sensor Products, Solid State Electronics Center, 4 pages.

* cited by examiner

MAGNETIC FIELD SENSOR WITH INCREASED FIELD LINEARITY

CROSS REFERENCE TO RELATED APPLICATIONS

This application is a continuation application of pending U.S. patent application Ser. No. 15/134,134, filed Apr. 20, 2016, which claims the benefit of priority to U.S. Provisional Application No. 62/154,210, filed Apr. 29, 2015, each of which is herein incorporated by reference in their entirety.

TECHNICAL FIELD

The present inventions relate generally to the field of magnetic field sensors and more particularly to methods of increasing linearity of magnetic field sensors.

BACKGROUND OF THE INVENTION

Magnetic field sensors have been commonly used in various electronic devices, such as computers, laptops, media players, smart phones, etc. There are several techniques/devices that can be used for detecting a magnetic field. Magnetoresistance (MR) magnetic sensor is a promising magnetic sensing technology for handset applications due to its advantages in sensitivity, power, and process cost compared with other magnetic sensors. MR magnetic sensors may include Giant Magnetoresistance (GMR) sensors, Anisotropic Magnetoresistance (AMR) sensors, Tunneling Magnetoresistance (TMR) sensors, or the like.

A TMR element is composed of two ferromagnetic layers separated by a non-magnetic, insulating tunnel barrier. One layer has a magnetization direction that is "free" to rotate in a magnetic field. The other layer has a "fixed," reference magnetization that does not rotate when in a magnetic field of moderate to low strength that is of sensing interest. If the magnetization directions of the two layers are parallel to each other, the electrical resistance of the tunnel barrier is low. Conversely, when the magnetization directions are anti-parallel, the resistance is high. A magnetic field sensor based on TMR therefore converts magnetic field into electrical signal by a change in electrical resistance due to the changing angle of the magnetic free layer relative to the fixed layer in response to the field.

Magnetoresistance magnetic sensors, including TMR sensors, all suffer from cross-axis effects. While these sensors are designed to sense magnetic fields in one desired sensitive axis, there is a minor sensitivity to fields orthogonal to the sensitive axis. These orthogonal fields are called cross-fields or cross-axis magnetic fields. The cross-axis effect is characterized by the amount of on-axis sensitivity suppression due to cross-field intensity.

Cross-axis effects may occur from a number of sources, including fixed magnetic sources in the final use environment (i.e., a speaker magnet or inductor in cell phone) and dimensional characteristics of the MR element design. These cross-fields will create various amounts of cross-field error to the magnetic field in the desired sensitive axis.

Magnetic sensor output processing algorithms may compensate for offset and uniform sensitivity mismatch between axes, but not field dependent sensitivity differences. Therefore, reduction of cross-axis effects is crucial to sensor performance. It would be desirable to have a system, device, and method to effectively increase magnetic field measurement linearity and minimize cross-axis interferences.

SUMMARY OF THE INVENTION

Certain embodiments of the inventions provide for systems, devices, and methods to effectively increase magnetic field measurement linearity and minimize cross-axis interference.

The TMR field sensor comprises a first Wheatstone bridge circuit including a plurality of TMR transducer legs configured to sense a magnetic field. Each TMR transducer leg comprises an array of multiple active sense elements arranged in an m×n matrix. Each sense element comprises a first ferromagnetic layer (free layer) and a second ferromagnetic layer (fixed layer) separated by a non-magnetic, insulating tunnel barrier.

The TMR transducer leg further comprises a plurality of built-in current lines located adjacent to the second ferromagnetic layer (e.g., the fixed layer) of each sense element. The current lines are coupled to a reset current source, and a reset current is applied to the built-in current lines. When the reset current is applied, a magnetic field is generated on the first ferromagnetic layer (e.g., the free layer), Depending on the direction (or polarity) of the applied reset current, the generated magnetic field switches the magnetization of the first ferromagnetic layer into a first or second alignment.

In some embodiments, the current lines are routed such that two or more sense elements have magnetic responses to have opposing contributions from the cross-axis effect for a given field direction in each transducer leg. Therefore, overall field response from each transducer leg is internally compensated and the TMR field sensor has an output with minimal cross-axis interference.

While the present inventions are discussed below using TMR magnetic fields sensors having TMR elements, all aspects of the inventions will directly apply to devices based on giant magnetoresistance (GMR) technology as well. The inventions disclosed here also apply to any magnetic sensing technology that utilizes soft-magnetic films for sensing magnetic fields, such as, for example, anisotropic magnetoresistance (AMR), Fluxgate, Hall sensors with a flux concentrator. For simplicity and clarity, the inventions will be described in more detail below using TMR technology as an example.

BRIEF DESCRIPTION OF THE DRAWINGS

Reference will be made to exemplary embodiments of the present inventions that are illustrated in the accompanying figures. Those figures are intended to be illustrative, rather than limiting. Although the present inventions are generally described in the context of those embodiments, it is not intended by so doing to limit the scope of the present inventions to the particular features of the embodiments depicted and described.

Figure 1:
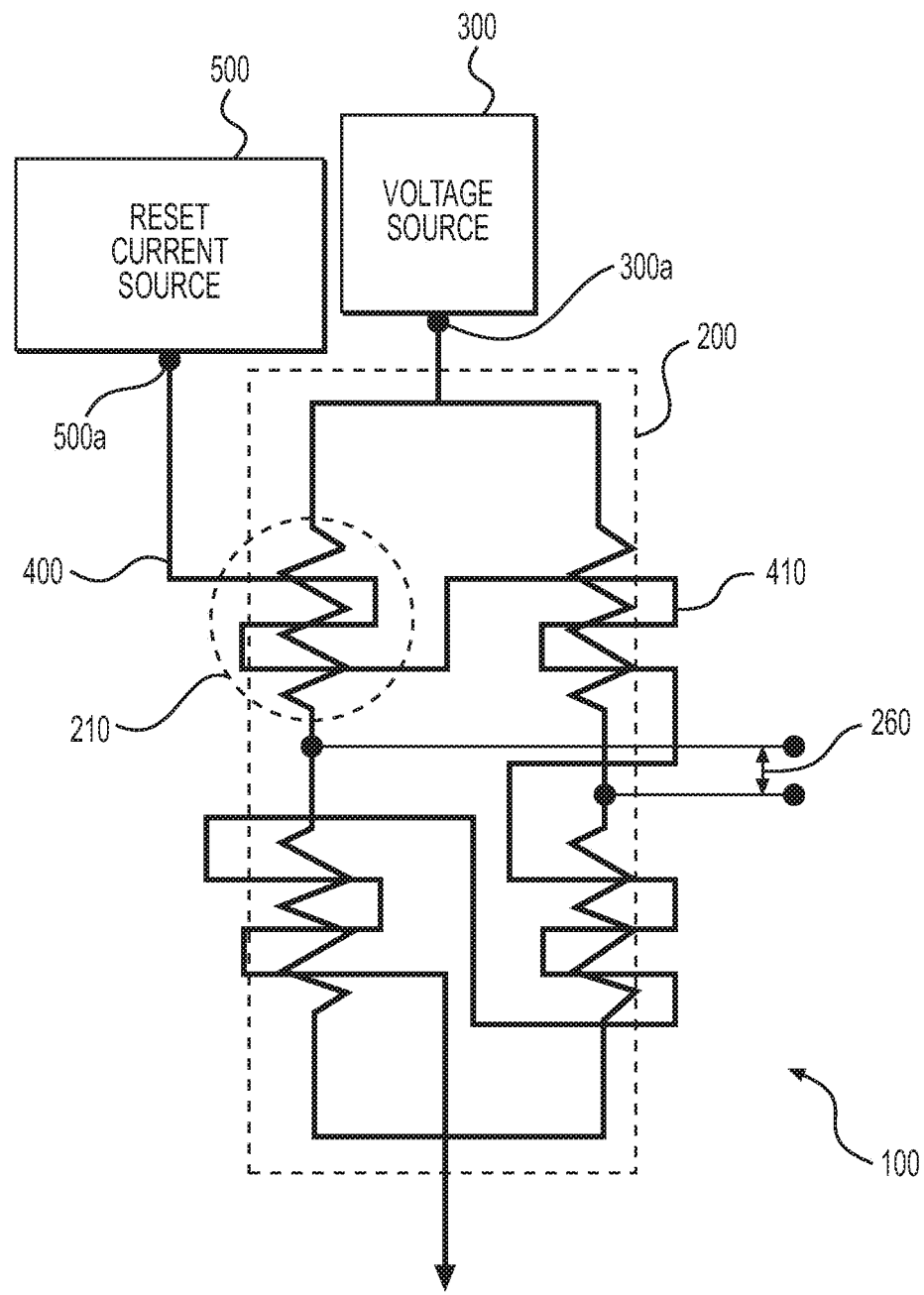
FIG. 1 depicts an exemplary structure overview of a TMR magnetic field sensor according to various embodiments of the inventions.

One skilled in the art will recognize that various implementations and embodiments of the inventions may be practiced in accordance with the specification. All of these implementations and embodiments are intended to be included within the scope of the inventions.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION OF THE PREFERRED EMBODIMENTS

In the following description, for the purpose of explanation, specific details are set forth in order to provide an understanding of the present inventions. The present inventions may, however, be practiced without some or all of these details. The embodiments of the present inventions described below may be incorporated into a number of different electrical components, circuits, devices, and systems. Structures and devices shown in block diagram are illustrative of exemplary embodiments of the present inventions and are not to be used as a pretext by which to obscure broad teachings of the present inventions, Connections between components within the figures are not intended to be limited to direct connections, Rather, connections between components may be modified, re-formatted, rerouted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present inventions. Thus, the appearance of the phrase, "in one embodiment," in different places in the specification does not constitute a plurality of references to a single embodiment of the present inventions.

Various embodiments of the inventions are used provide for systems, devices, and methods to effectively increase magnetic field measurement linearity and minimize cross-axis interference. The TMR transducer leg, voltage source, and the reset current source therein, may be integrated on a single component or contain discrete components. Furthermore, embodiments of the inventions are applicable to a diverse set of techniques and methods.

As mentioned above, the magnetic field sensors as claimed herein may mean one or more of TMR magnetic fields sensors, GMR magnetic field sensors, AMR magnetic field sensors, Fluxgate magnetic field sensors, and/or Hall magnetic field sensors with a flux concentrator. Further, magnetoresistance sense elements as claimed herein may mean one or more of TMR elements, GMR elements, AMR elements, Fluxgate elements, and/or Hall elements with flux concentrators.

FIG. 1 shows a schematic diagram of a TMR magnetic field sensor 100, according to various embodiments of the inventions. The magnetic field sensor 100 comprises a first bridge circuit 200 powered by a voltage source 300 connected via a voltage source connection 300a, and a second circuit 400 powered by an optional reset field source 500, which may be a current source, connected via a reset field source connection 500a. The first bridge circuit 200 comprises a plurality of TMR transducer legs 210. The bridge circuit 200 may be a half bridge circuit, a full bridge circuit, or any combinations thereof. In one embodiment, the bridge circuit 200 is a bridge circuit having two circuit branches with a bridge output signal 260 between the two branches at some intermediate point along the branches. The TMR transducer leg 210 electrically functions as a resistor with its resistance value variable in response to internal and external magnetic fields. Each transducer leg 210 has at least one built-in current line 410 coupled to the reset field source 500, via the reset field source connection 500a.

Figure 2:
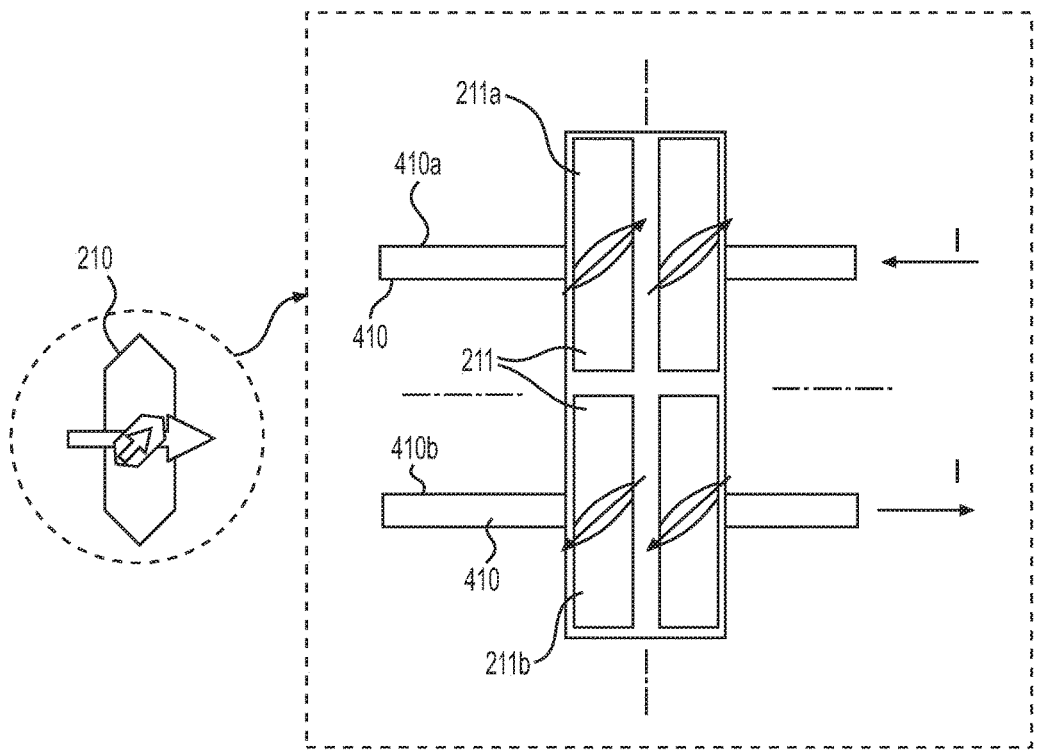
FIG. 2 depicts an exemplary structure overview of a TMR transducer leg field sensor with multiple sense elements according to various embodiments of the inventions.

FIG. 2 depicts an exemplary structure overview of a TMR transducer leg 210, with multiple sense elements 211, according to various embodiments of the inventions. Each TMR transducer leg 210 comprises an array of multiple active TMR sense elements 211a and 211b, preferably arranged in a matrix layout. In one embodiment, each TMR transducer leg 210 comprises an array of 24×24 TMR sense elements 211, which is approximately 100×100 um$^2$ in size overall. The current flow in current lines 410a and 410b of each TMR sense element 211 may or may not be the same direction. In one embodiment, a TMR sense element 211a may have the opposite current direction relative to a current line of a neighbor TMR sense element 211b.

Figure 3:
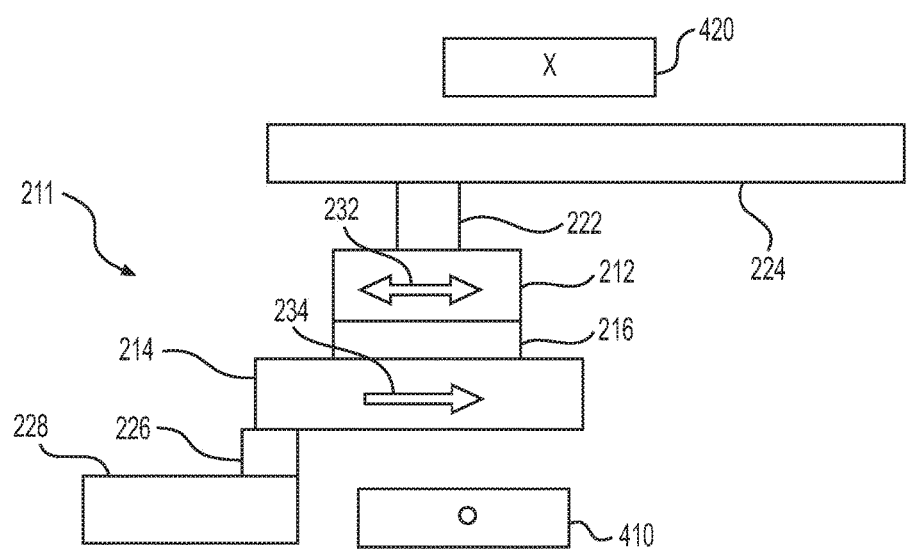
FIG. 3 depicts a cross-section view of a single sense element according to various embodiments of the inventions.

FIG. 3 illustrates a cross-section view of a single TMR sense element 211, according to various embodiments of the inventions. The TMR sense element 211 is composed of a first ferromagnetic layer 212 (free layer) and a second ferromagnetic layer 214 (fixed layer) separated by a non-magnetic, insulating tunnel barrier 216. In one embodiment, the first layer 212 has a magnetization direction 232 that is free to rotate in a magnetic field. The second layer 214 has a fixed reference magnetization direction 234 that does not rotate when in a magnetic field. If the magnetization directions of the two layers are parallel to each other, the electrical resistance of the tunnel barrier 216 is relatively low. Conversely, when the magnetization directions are antiparallel, the resistance is relatively higher.

The TMR sense element 211 therefore converts a magnetic field into an electrical signal by changing the electrical resistance due to a changing angle of the magnetization direction 232 of the magnetic free layer relative to the reference magnetization direction 234 of the fixed layer in response to the field. The ferromagnetic layers 212 and 214 may be formed from any suitable ferromagnetic material, such as Ni, Fe, Co, or their alloys. The insulating tunnel barrier 216 may be composed of insulator materials such as AlOx, MgOx, ZrOx, TiOx, HfOx, or any combinations thereof.

In one embodiment, the first ferromagnetic layer 212 is connected to a first conductive line 224 by a first contact 222, and the second ferromagnetic layer 214 is connected to a second conductive line 228 by a second contact 226, which may contact from above and/or below the second ferromagnetic layer 214.

In one embodiment, a built-in current line 410 is located adjacent to the second ferromagnetic layer 214 of each TMR sense element 211, The current lines 410 are connected such that a current pulse is applied to the current line 410 for each TMR sense element 211. The connection of the current lines 410 may be sequential, serial, or time multiplexed, according to various embodiments. In another embodiment, a second plurality of built-in current lines 420 may be located adjacent to the first ferromagnetic layer 212. A current line 420 may couple to the same reset current source 500 with the same or different connection path as a connection path of a current line 410. Alternatively, the current line 420 may couple to a different reset source to provide an additional control means.

In one embodiment, the first ferromagnetic layer 212 is designed as a shape that has a long axis and a short axis. In a zero magnetic field, the magnetization direction 232 of the first ferromagnetic layer 212 lies along the long axis of the element 211, and can be directed in either of the two directions along this axis. By applying a reset current signal to the current line 410 and/or the current line 420, an induced magnetic field is generated in an ambient area surrounding the current line 410/420. Since the first layer 212 has a magnetization direction 232 that is free to rotate and switch, the magnetization direction 232 will switch to along the direction projected on its axis by the induced magnetic field. As an exemplary illustration in FIG. 3, when the current in the current line 410 has a direction pointing outward relative to the page and the current in the current line 420 has a direction pointing inward relative to the page, the magnetization direction 232 points leftward, which has a component that is negatively aligned to the reference magnetization direction 234, and will switch the magnetization direction 232 of free layer to the left; when the current in the current line 410 has a direction pointing inward and/or the current in the current line 420 has a direction pointing outward, the magnetization direction 232 points rightward, which has a component that is positively aligned to the reference magnetization direction 234, and will switch the magnetization direction 232 of the free layer to the right.

Figure 4A:
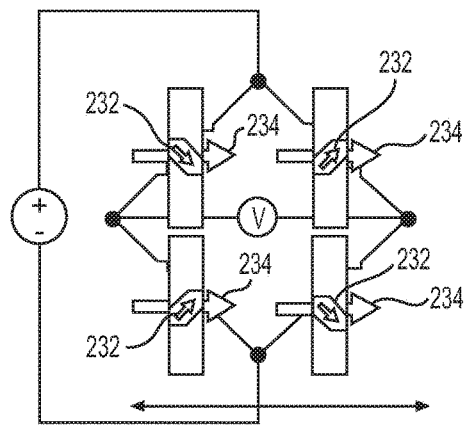
FIGS. 4A-4B depict exemplary diagrams of bridge circuits for measurement of X- or Y-axes of a magnetic field, with current lines energized according to various embodiments of the inventions.
Figure 4B:
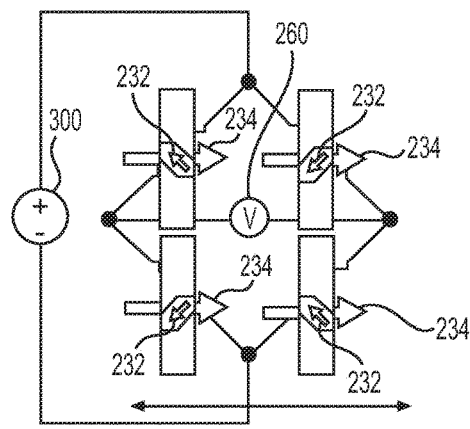

FIGS. 4A and 4B depict exemplary diagrams of bridge circuits for measurement of X- or Y-axes of a magnetic field, with current lines energized, according to various embodiments of the inventions. When a current pulse is applied to the current line, such as to a built-in current line 410 as shown in FIG. 3, a magnetic field pulse with a magnetization direction 232 is generated on the first ferromagnetic layer. Depending on the polarity of the applied current pulse, the generated magnetic field switches the free layer direction 232 to have a component that is positively or negatively aligned to the reference magnetization direction 234 of the second ferromagnetic layer. FIG. 4A shows a generally positively aligned magnetization direction 232 in the first ferromagnetic layer 212, and FIG. 4B shows a generally negatively aligned magnetization direction 232 in the first ferromagnetic layer 212.

Figure 5A:
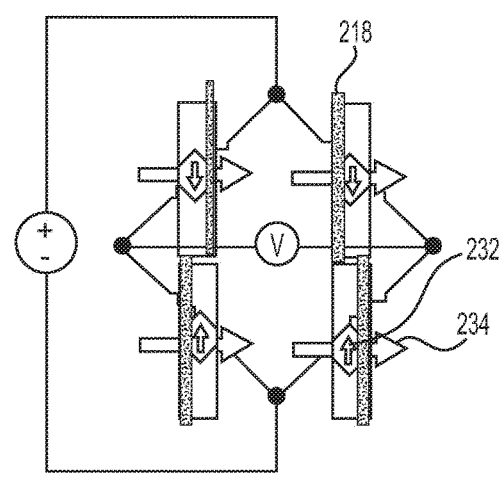
FIGS. 5A-5B depict exemplary diagrams of bridge circuits for measurement of a Z-axis of a magnetic field, with current lines energized according to various embodiments of the inventions.
Figure 5B:
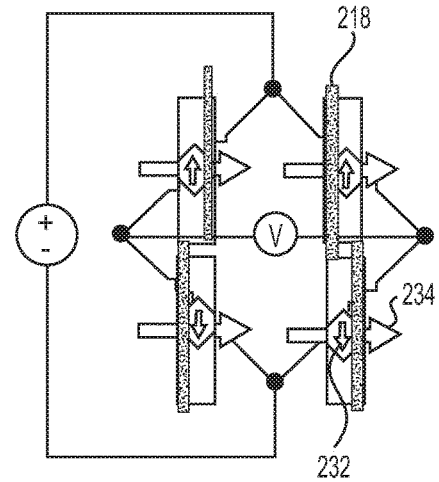

FIGS. 5A and 5B depict exemplary diagrams of bridge circuits for measurement of a Z-axis of a magnetic field, with current lines energized, according to various embodiments of the inventions. For Z-axis magnetic sensing, each TMR sense element 211 integrates at least one flux guide 218, which may be located in similar or different coupling for each sense element. The flux guide 218 is a high aspect ratio vertical bar made from a high permeability magnetic material with ends terminating in close proximity to opposed edges of the TMR sense element, in each respective bridge leg. In one embodiment, the flux guide 218 may be deposited or disposed above and/or below the first (free) ferromagnetic layer 212. The flux guide 218 captures magnetic flux from an applied field oriented in the Z direction, and bends the field lines to have a horizontal component near the ends of the flux guides 218, which rotates the magnetization direction 232 of the TMR sense element. FIGS. 5A and 5B show two exemplary Z-axis bridge configurations, with different magnetization directions 232 of the TMR sense element. While magnetization directions 232 may point in opposing directions within a given bridge leg, each bridge leg may also point in opposing directions.

Figure 6:
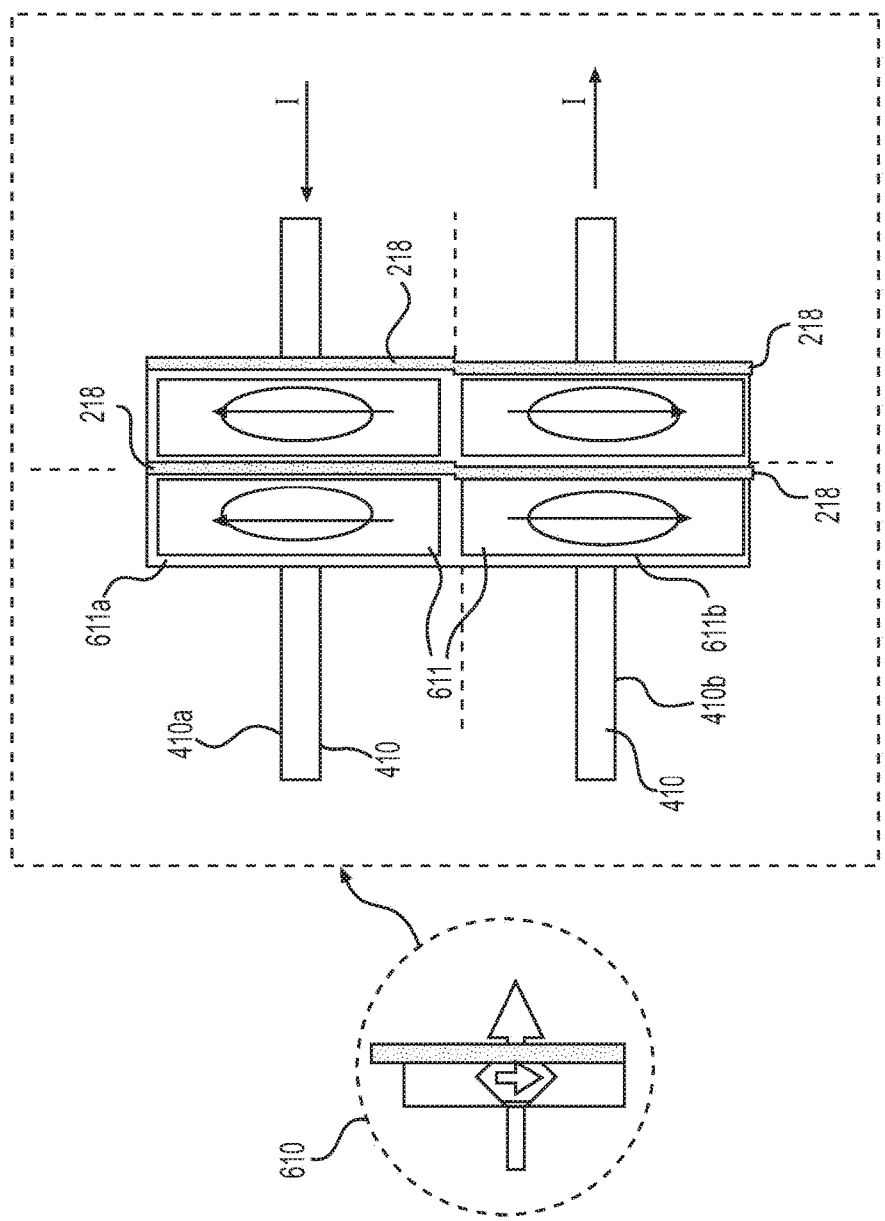
FIG. 6 depicts an exemplary structure overview of a Z-axis TMR transducer leg field sensor, with multiple sense elements according to various embodiments of the inventions.

FIG. 6 depicts an exemplary structure overview of a Z-axis TMR transducer leg 610, with multiple sense elements 611 according to various embodiments of the inventions. Each Z-axis TMR transducer leg 610 comprises an array of multiple active Z-axis TMR sense elements 611a and 611b, preferably arranged in a matrix layout. In one embodiment, each Z-axis TMR transducer leg 610 comprises an array of 60×40 Z-axis TMR sense elements 611, which is approximately 150×200 um$^2$ in size overall. While flux guides 218 are shown on the right side and underneath the Z-axis TMR sense elements 611, as illustrated in FIG. 6, it is understood that the flux guides 218 may be located on the left side and/or above the Z-axis TMR sense elements 611. The Z-axis sensitivity may be doubled by placing flux guides on opposing sides and planes of the sense element; i.e. right side, underneath and left side, above. The current flow in current lines 410 of each Z-axis TMR sense element 611 may or may not be the same direction. In one embodiment, a Z-axis TMR sense element 611a may have the opposite current direction in the current line 410a relative to a neighbor Z-axis TMR sense element 611b.

Figure 7:
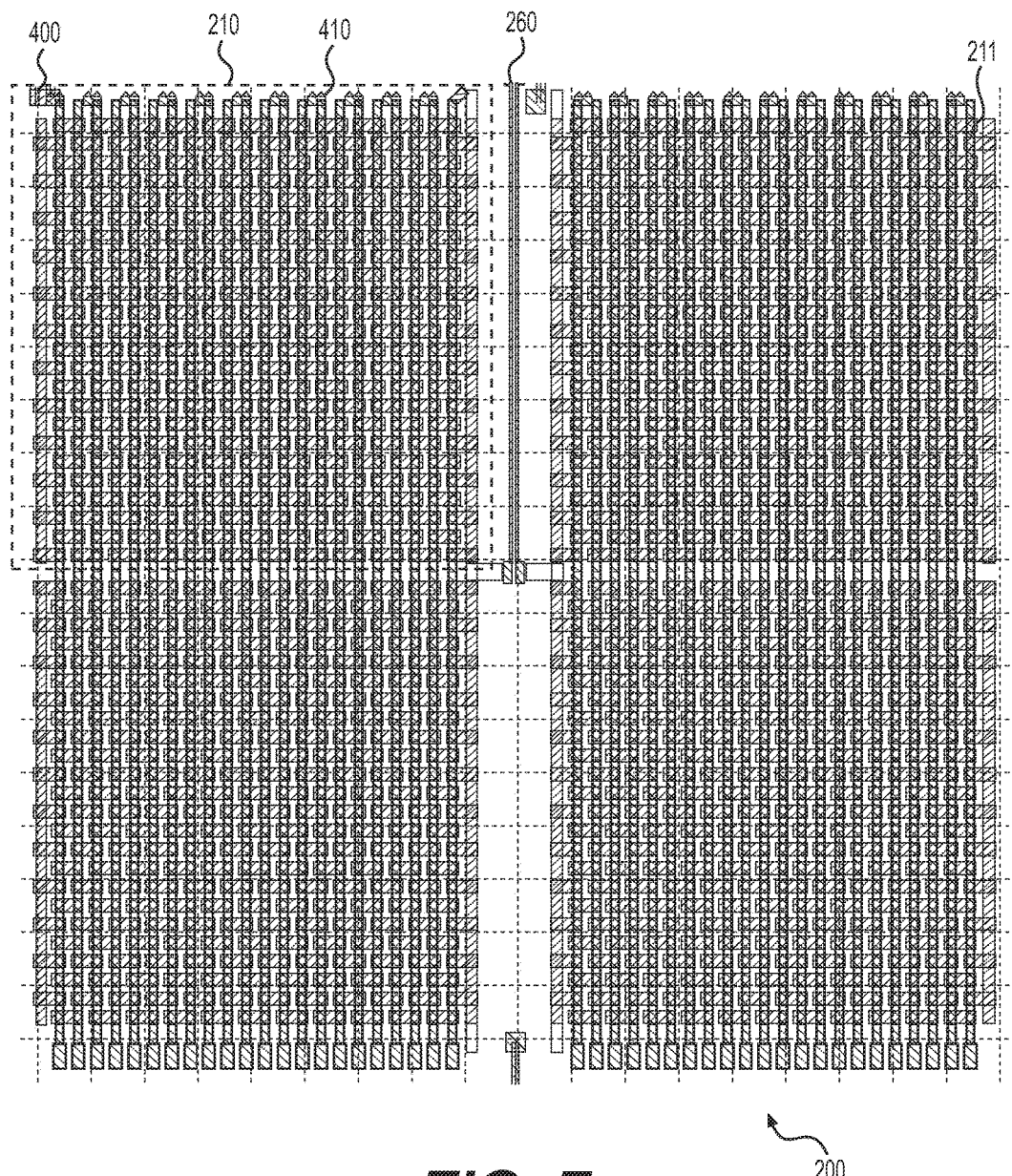
FIG. 7 depicts an exemplary diagram of a bridge circuit with a structure view of the multiple TMR sense elements according to various embodiments of the inventions.

FIG. 7 depicts an exemplary diagram of a bridge circuit with a structure view of the multiple TMR sense elements, according to various embodiments of the inventions. The bridge circuit 200 comprises four TMR transducer legs 210 forming a Wheatstone bridge circuit with a bridge output signal 260. Each transducer leg 210 comprises an array of TMR sense elements 211 in a sense element matrix layout. The built-in current line 410 of each TMR sense element 211 of one TMR transducer leg 210 is routed to form the second circuit 400.

Figure 8:
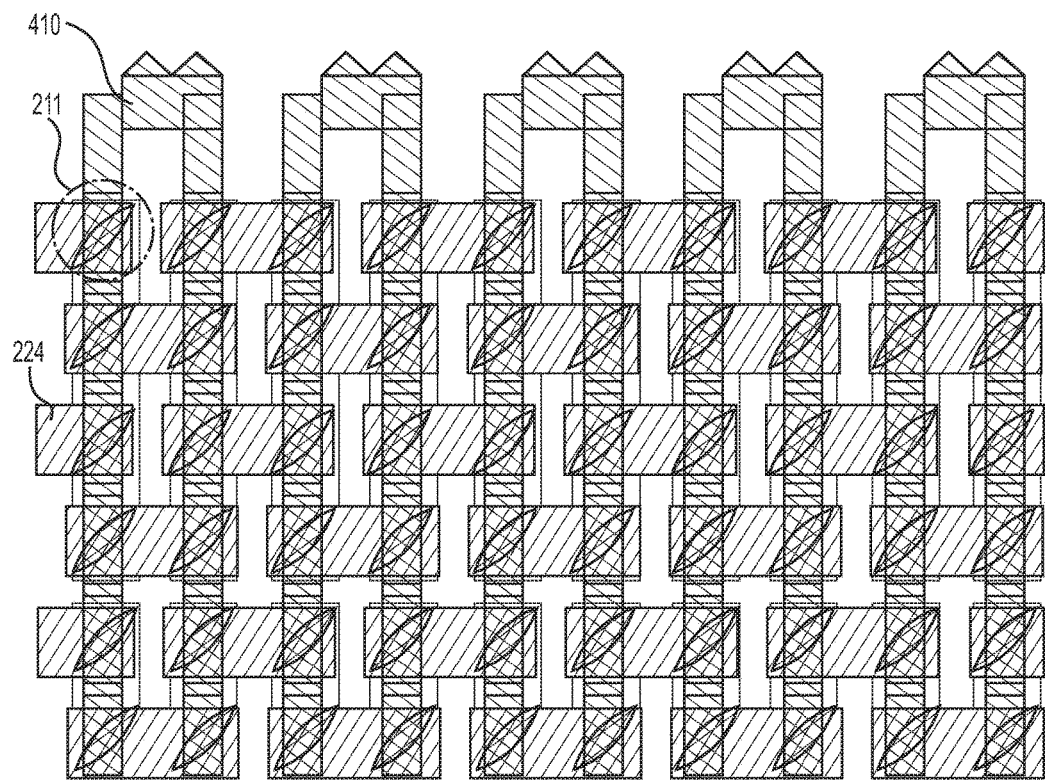
FIG. 8 depicts an exemplary structure overview of TMR sense element current lines routed with a first pattern according to various embodiments of the inventions.

FIG. 8 depicts an exemplary structure overview of TMR sense element current lines 410 routed with a first pattern, according to various embodiments of the inventions. The current lines 410 are routed to form paths in opposing directions on adjacent columns within the sense element matrix. Such a routing pattern ensures that two or more sense elements 211 have magnetic responses with opposing contributions from the cross-axis effect for a given field direction in each transducer leg within the TMR sensor. While each path covers one column as illustrated in FIG. 8, it is understood that various other configurations of paths may be utilized in a similar way and such variations are still within the scope of the inventions.

FIGS. 9A-9D depict exemplary structure overviews of TMR sense element magnetization arrangements resultant from current line routing to further illustrate additional embodiments of the inventions. For figure clarity, the current lines are not shown directly. Instead, the magnetization direction 232 of the first layer (free layer) 212 of a TMR sense element 211 indicates the routing pattern of the current line. Only a 4×4 element matrix is used for illustration purposes. The routing pattern disclosed in FIG. 8 is applicable to a whole transducer leg for a TMR sensor.

Figure 9:
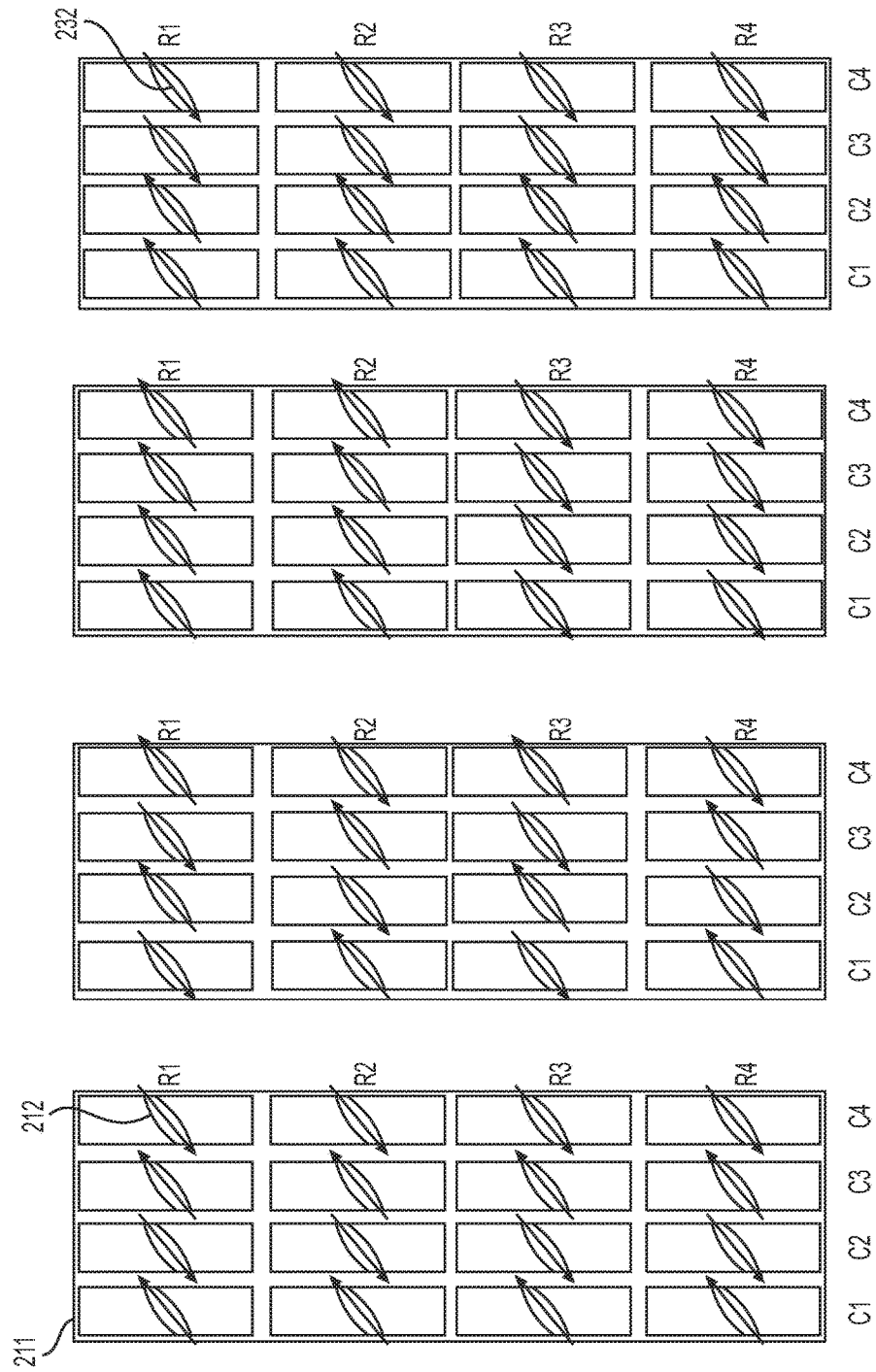
FIGS. 9A-9D show several exemplary structure overviews of TMR sense element magnetization orientations according to various embodiments of the inventions.

In FIG. 9A, the current lines of sense elements 211 within the same column have the same current flow direction (such as in columns C1 and C3). The current lines of sense elements at one column have the opposite current flow direction to the current lines of sense elements at the neighbor columns. For example, current flow in column C1 is opposite to the current flow in column C2.

In FIG. 9B, the current lines of each sense element has the opposite current flow direction to the current line of all row and column neighbor sense elements. For example, the sense element at R2C2 (second row and second column) has opposite current flow direction in an associated current line relative to all the neighbor sense elements (at positions of R1C2, R2C1, R3C2 and R2C3). The current line of a sense element has the same current flow direction to the current lines of sense elements at the diagonal neighbor sense elements. For example, current flow in sense element at position of R2C2 has the same current flow direction as sense elements at position of R1C1 and R3C3.

In FIG. 9C, the current lines of sense elements within two consecutive rows have the same current flow direction (such as in rows R1 and R2). Also, the current lines of sense elements at first two consecutive rows have the opposite current flow direction relative to the current lines of sense elements at the next two consecutive rows.

In FIG. 9D, the current lines of sense elements within two consecutive columns have the same current flow direction (such as in column C1 and C2). Also, the current lines of sense elements at first two consecutive columns have the opposite current flow direction relative to the current lines of sense elements at the next two consecutive columns.

While only four different types of current routing patterns are illustrated in FIGS. 9A-9D, it is understood that more than various other types of routing patterns may be utilized in a similar way and such variations are still within the scope of the inventions. While ideally such patterns generate equal population of both sense element orientations, with different spatial arrangements for optimal cancelation, populations may not be equal depending upon other system constraints.

The bipolar arrangement of Z-axis magnetization for cross-axis reduction may be further augmented beyond the transducer leg level cross-axis reduction. A complete Z cross-axis sensitivity calibration requires an understanding of functional form of the error residuals from the bipolar magnetization arrangement of the Z-axis sensor. For Z-axis sensors where each transducer leg of a bridge consists of sense elements with a common flux guide direction, the Z-axis sensor cross-axis functional form is roughly parabolic in one axis and linear in the other. For accurate compensation, one needs the parameters of Z-axis electrical offset, Z-axis magnetic offset, parabolic interpolation of the Z-axis sensitivity dependence on a Y-axis field and linear interpolation of the Z-axis sensitivity dependence on a X-axis field. Additionally, X-axis and Y-axis sensors may be calibrated from determination of a X-axis total offset and sensitivity as well as a Y-axis total offset and sensitivity.

Figure 10:
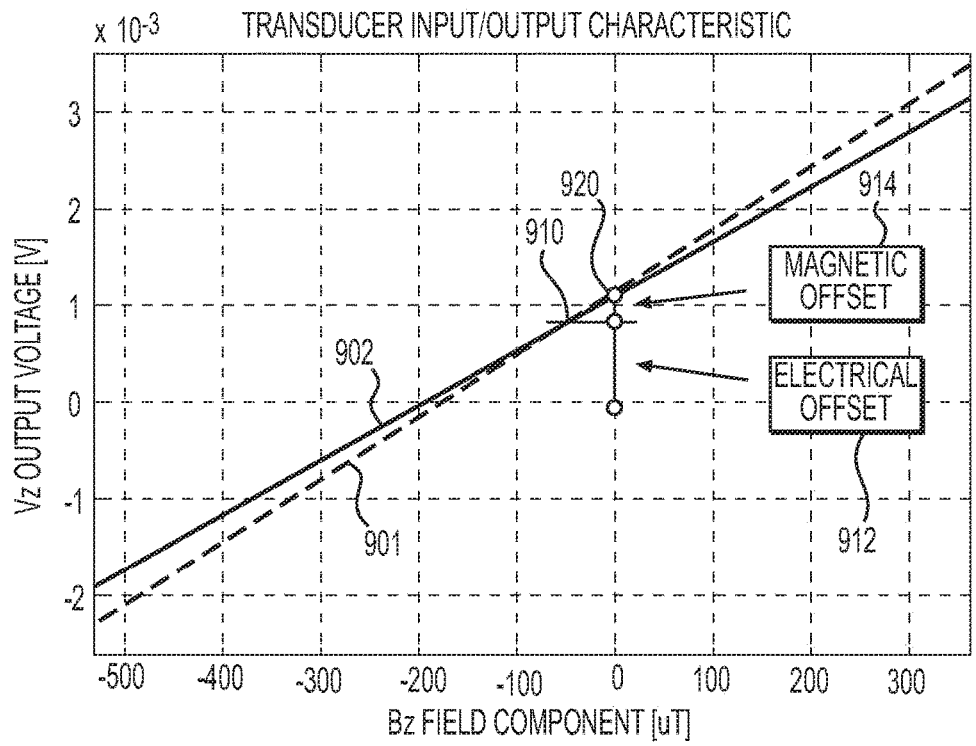
FIG. 10 is an exemplary illustration of defining electrical and magnetic offsets on a Z-axis magnetic sensor according to various embodiments of the inventions.

FIG. 10 shows an exemplary illustration of defining electrical and magnetic offsets on a Z-axis magnetic sensor, according to various embodiments of the inventions. In FIG. 10, a Z-axis magnetic sensor output voltage is plotted as a function of the Z-axis magnetic field with existence of two different values of cross-axis (X- or Y-axes) magnetic field by Monte-Carlo simulation. Line 901 corresponds to a zero cross-axis magnetic field, and line 902 corresponds to a certain cross-axis magnetic field. Both lines 901 and 902 are shifted away from the origin point due to electrical and magnetic offsets. Lines 901 and 902 have a cross-point 910, and the electrical offset 912 is the vertical shift of the cross-point 910 from the origin point. The magnetic offset 914 corresponds to the vertical shift between point 910 and 920, which is the point on line 901 or line 902 with a zero Z-axis magnetic field. The magnetic offset 914 depends on an actual cross-axis (X- or Y-axis) magnetic value.

After obtaining the electrical offset 912 and the magnetic offset 914, the real magnetic field value can be extracted from Z-axis output data after taking into consideration the electrical offset, the magnetic offset, as well as the cross-interference from X- and Y-axes magnetic fields. The Z-axis calibration procedure comprises sequential steps of calibration of electrical offset, calibration of sensitivity and cross-sensitivity, and calibration of magnetic offset. In one embodiment, the cross-sensitivity calibration is implemented by multiplying the Z-axis sensor output voltage by a nominal sensitivity and dividing by a polynomial function, which contains the measured sensitivity in the constant term and is second order in a Y-axis field and first order in an X-axis field. The second and first order determination of the polynomial dependence on X- and Y-axes fields is dependent on the Z-axis sensor layout symmetry, and may be reversed, or a different order polynomial may be utilized depending on the final Z-axis layout symmetry with respect to X- and Y-axes magnetic field definitions. The utilized Y-axis field and X-axis field must first be compensated through their own respective offsets and sensitivity calibrations that are programmed into a chip from measurements performed during a final test. For determination of the polynomial, in the example outlined above, it is preferred to take Z-axis sensitivity measurements at three different field values for the Y-axis and two different field values for the X-axis, but a lesser number of field values may be utilized from fits to a sub population of sensors to extract a generalized fit function applicable to all sensors.

Figure 11:
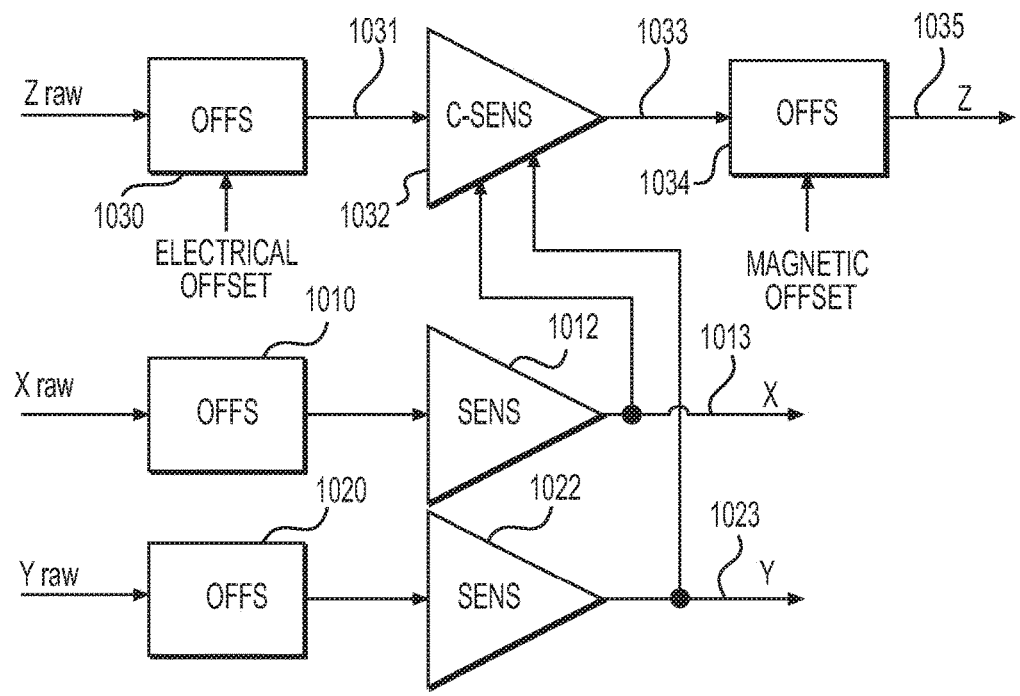
FIG. 11 depicts an exemplary three axis calibration scheme according to various embodiments of the inventions.

FIG. 11 shows an exemplary three axis calibration scheme, according to various embodiments of the inventions. The X-axis sensor output (X-raw data) goes through an X-axis electrical offset calibration (step 1010) and an X-axis sensitivity calibration (step 1012) for extraction of an actual X-axis magnetic field (step 1013). Similarly, the Y-axis sensor output (Y-raw data) goes through a Y-axis electrical offset calibration (step 1020) and a Y-axis sensitivity calibration (step 1022) for extraction of an actual Y-axis magnetic field (step 1023).

For the Z-axis, the Z-axis sensor output (Z-raw data) goes through a Z-axis electrical offset calibration (step 1030), a Z-axis sensitivity calibration (step 1032), and an additional Z-axis magnetic offset calibration (step 1034) for extraction of an actual Z-axis magnetic field (step 1035). In addition to receiving an output signal (step 1031) from the Z-axis electrical offset calibration step 1030, the Z-axis sensitivity calibration (step 1032) also receives inputs of the actual X-axis magnetic field (step 1013) and the actual Y-axis magnetic field (step 1023) for the generation of a cross-axis sensitivity calibrated signal output (step 1033), which then goes through the Z-axis magnetic offset calibration (step 1034) for extraction of actual Z-axis magnetic field (step 1035).

One skilled in the art will recognize that various implementations may be realized within the described architecture, all of which fall within the scope of the inventions. The foregoing description of the inventions has been described for purposes of clarity and understanding. It is not intended to limit the inventions to the precise form disclosed. Various modifications may be possible within the scope and equivalence of the application.

What is claimed is:

1. A magnetic field sensor, comprising:
a plurality of transducer legs coupled together as a first circuit configured to sense a magnetic field, wherein each transducer leg includes a plurality of magnetoresistance sense elements; and
a second circuit including a first plurality of current lines, wherein each current line of the first plurality of current lines is proximate a first set of corresponding magnetoresistance sense elements of the plurality of magnetoresistance sense elements of a transducer leg;
wherein, when at least one current line of the first plurality of current lines is energized, a magnetization of a first subset of magnetoresistance sense elements of the first set of magnetoresistance sense elements is aligned in a first direction, and
wherein a routing pattern of the at least one current line is configured to generate a population of magnetoresistance sense elements with magnetizations aligned in the first direction or a second direction opposite to the first direction.

2. The magnetic field sensor of claim 1, wherein the first subset of magnetoresistance sense elements includes two or more magnetoresistance sense elements.

3. The magnetic field sensor of claim 1, wherein, when the at least one current line is energized, a magnetization of a second subset of magnetoresistance sense elements of the first set of magnetoresistance sense elements is aligned in the second direction opposite to the first direction.

4. The magnetic field sensor of claim 1, wherein, when the at least one current line is energized, a magnetization of a second subset of magnetoresistance sense elements of the first set of magnetoresistance sense elements is aligned in the second direction opposite to the first direction, and wherein the second subset of magnetoresistance sense elements includes the remaining magnetoresistance sense elements of the plurality of magnetoresistance sense elements not included in the first subset of magnetoresistance sense elements.

5. The magnetic field sensor of claim 1, wherein the magnetic field sensor is configured to reduce a cross-axis interference as a function of an electrical offset and a magnetic offset.

6. The magnetic field sensor of claim 1, wherein each magnetoresistance sense element of the plurality of magnetoresistance sense elements includes a first ferromagnetic layer and a second ferromagnetic layer separated by an intermediate layer; and
wherein the first ferromagnetic layer includes a magnetization direction free to rotate in a magnetic field, and wherein a magnetization of the second ferromagnetic layer does not rotate in the magnetic field.

7. The magnetic field sensor of claim 1, wherein the plurality of magnetoresistance sense elements includes one or more tunneling magnetoresistance sense elements, giant magnetoresistance sense elements, and/or anisotropic magnetoresistance sense elements.

8. The magnetic field sensor of claim 1, wherein the first circuit is a half bridge circuit or a full bridge circuit.

9. The magnetic field sensor of claim 1, wherein at least one magnetoresistance sense element of the plurality of magnetoresistance sense elements includes at least one flux guide.

10. The magnetic field sensor of claim 1, wherein the plurality of magnetoresistance sense elements are arranged in a sense element matrix having a plurality of columns and a plurality of rows, and
wherein each current line of the first plurality of current lines is configured to generate a magnetic field to align the magnetization of the plurality of magnetoresistance sense elements.

11. The magnetic field sensor of claim 10, wherein, when the at least one current line is energized, the routing pattern of the at least one current line is configured to generate a magnetic field that causes a first magnetization direction of a first magnetoresistance sense element of a first column of the plurality of columns and a first row of the plurality of rows to have an opposite alignment to a magnetization direction of a second magnetoresistance sense element in a column adjacent to the first column and in the first row, and causes the first magnetization direction to be opposite to the magnetization direction of a third magnetoresistance sense element in a row adjacent to the first row and in the first column.

12. A magnetic field sensor, comprising:
a plurality of transducer legs coupled together as a first circuit configured to sense a magnetic field, wherein each transducer leg comprises a plurality of magnetoresistance sense elements; and
a second circuit comprising a first plurality of current lines, wherein each current line of the first plurality of current lines is adjacent to a corresponding one or more magnetoresistance sense elements of a transducer leg of the plurality of transducer legs;
wherein, when at least one current line of the first plurality of current lines is energized, a magnetization of a first subset of magnetoresistance sense elements of the transducer leg is aligned in a first direction, and wherein the magnetic field sensor is configured to reduce a cross-axis interference as a function of an electrical offset and a magnetic offset, and
wherein a routing pattern of the at least one current line is configured to generate a population of magnetoresistance sense elements with magnetizations aligned in the first direction or a second direction opposite to the first direction.

13. The magnetic field sensor of claim 12, wherein, when the at least one current line of the first plurality of current lines is energized, a magnetization of a second subset of magnetoresistance sense elements of the transducer is aligned in the second direction.

14. The magnetic field sensor of claim 12, wherein, when the at least one current line of the first plurality of current lines is energized, a magnetization of a second subset of magnetoresistance sense elements of the transducer is aligned in the second direction, and wherein the second subset includes the remaining magnetoresistance sense elements of the plurality of magnetoresistance sense elements not included in the first subset of magnetoresistance sense elements.

15. The magnetic field sensor of claim 12, wherein the magnetic field sensor is configured to reduce the cross-axis interference by applying a polynomial function, and wherein the order of the polynomial function is dependent on a layout of the magnetic field sensor.

16. The magnetic field sensor of claim 12, wherein, when the at least one current line is energized, the routing pattern of the at least one current line is configured to generate a magnetic field that causes a first magnetization direction of a first magnetoresistance sense element of a first column of the plurality of columns and a first row of the plurality of rows to have an opposite alignment to a magnetization direction of a second magnetoresistance sense element in a column adjacent to the first column and in the first row, and causes the first magnetization direction to be opposite to the magnetization direction of a third magnetoresistance sense element in a row adjacent to the first row and in the first column.

17. A magnetic field sensor, comprising:
 a plurality of transducer legs coupled together as a first circuit configured to sense a magnetic field, wherein each transducer leg comprises a plurality of magnetoresistance sense elements; and
 a second circuit comprising a first plurality of current lines, wherein each current line of the first plurality of current lines is adjacent to a corresponding plurality of magnetoresistance sense elements of a transducer leg of the plurality of transducer legs;
 wherein the plurality of magnetoresistance sense elements are arranged in a sense element matrix having a plurality of columns and a plurality of rows, wherein each current line of the first plurality of current lines is configured to generate a magnetic field to align the magnetization of the plurality of magnetoresistance sense elements in a first magnetization direction or in a second magnetization direction opposite to the first magnetization direction, and wherein a routing pattern of the first plurality of current lines is configured to generate the first magnetization direction in each magnetoresistance sense element in at least one column or row and to generate the second magnetization direction in each magnetoresistance sense element in at least one other column or row.

18. The magnetic field sensor of claim 17, wherein the routing pattern of the first plurality of current lines is configured to generate the first magnetization direction in each magnetoresistance sense element in a first column, and the second magnetization direction in each magnetoresistance sense element in a second column, wherein the second column is adjacent to the first column.

19. The magnetic field sensor of claim 17, wherein the routing pattern of the first plurality of current lines is configured to generate the first magnetization direction in each magnetoresistance sense element in a first row, and the second magnetization direction in each magnetoresistance sense element in a second row, wherein the second row is adjacent to the first row.

20. The magnetic field sensor of claim 17, wherein the routing pattern of at least one current line is configured to generate a population of magnetoresistance sense elements with magnetizations aligned in the first magnetization direction or in the second magnetization direction.

* * * * *